(12) United States Patent
Butler

(10) Patent No.: US 7,583,110 B2
(45) Date of Patent: Sep. 1, 2009

(54) HIGH-SPEED, LOW-POWER INPUT BUFFER FOR INTEGRATED CIRCUIT DEVICES

(75) Inventor: Douglas Blaine Butler, Colorado Springs, CO (US)

(73) Assignee: ProMOS Technologies Pte.Ltd., Singapore (SG)

( * ) Notice: Subject to any disclaimer, the term of this patent is extended or adjusted under 35 U.S.C. 154(b) by 0 days.

(21) Appl. No.: 11/687,605

(22) Filed: Mar. 16, 2007

(65) Prior Publication Data

US 2007/0176650 A1 Aug. 2, 2007

Related U.S. Application Data

(63) Continuation of application No. 11/092,506, filed on Mar. 29, 2005, now Pat. No. 7,250,795.

(51) Int. Cl.
H03B 1/00 (2006.01)
(52) U.S. Cl. ............................ 327/112; 327/77; 327/93
(58) Field of Classification Search ................... 327/50, 327/56, 63, 91, 93, 112, 337, 390; 326/88
See application file for complete search history.

(56) References Cited

U.S. PATENT DOCUMENTS

| | | | |
|---|---|---|---|
| 4,585,956 A | 4/1986 | Lie | |
| 4,748,418 A * | 5/1988 | Kerth | 330/9 |
| 4,814,647 A | 3/1989 | Tran | |
| 4,954,983 A * | 9/1990 | Klingman | 710/11 |
| 5,214,330 A * | 5/1993 | Okazaki | 326/90 |
| 5,428,307 A | 6/1995 | Dendinger | |
| 5,563,546 A | 10/1996 | Tsukada | |
| 5,831,459 A | 11/1998 | McDonald | |
| 6,414,517 B1 | 7/2002 | Kim et al. | |
| 6,590,570 B1 | 7/2003 | Maki | |
| 6,628,146 B2 | 9/2003 | Tam | |
| 6,756,815 B2 * | 6/2004 | Van De Graaff | 326/82 |
| 6,873,209 B2 * | 3/2005 | Takata et al. | 330/253 |
| 6,885,226 B2 | 4/2005 | Waldrop | |
| 6,900,688 B2 * | 5/2005 | Tomari et al. | 327/534 |
| 6,906,563 B2 | 6/2005 | Mantri et al. | |
| 7,061,274 B2 * | 6/2006 | George | 326/86 |
| 7,250,795 B2 * | 7/2007 | Butler | 327/112 |

* cited by examiner

Primary Examiner—Lincoln Donovan
Assistant Examiner—Hai L Nguyen
(74) Attorney, Agent, or Firm—Peter J. Meza; William J. Kubida; Hogan & Hartson LLP

(57) ABSTRACT

A high-speed, low-power input buffer for an integrated circuit device in which the input voltage (VIN) is coupled to both a pull-up and a pull-down transistor. In accordance with a specific embodiment, the input buffer utilizes a reference voltage input (VREF) during a calibration phase of operation but not when in an active operational mode. A maximum level of through current is supplied when VIN=VREF with lower levels of through current at all other VIN voltages. In an integrated circuit device incorporating an input buffer as disclosed, two (or more) input buffers may be utilized per device input pin.

1 Claim, 5 Drawing Sheets

US 7,583,110 B2

HIGH-SPEED, LOW-POWER INPUT BUFFER FOR INTEGRATED CIRCUIT DEVICES

RELATED APPLICATION

The present application claims priority from, and is a continuation of, U.S. patent application Ser. No. 11/092,506 filed on Mar. 29, 2005. The disclosure of the foregoing United States Patent Application is specifically incorporated herein by this reference in its entirety and assigned to ProMOS Technologies PTE.LTD., Singapore, assignee of the present invention.

BACKGROUND OF THE INVENTION

The present invention relates, in general, to the field of integrated circuit (IC) devices. More particularly, the present invention relates to a high-speed, low-power input buffer for integrated circuit devices including memories such as dynamic random access memory (DRAM), synchronous DRAM, synchronous static random access memory (SRAM).

Signaling between integrated circuits is typically done using one of several signaling protocols. Most of these protocols specify a reference voltage (VREF). The input (VIN) is a valid logic level "high" when it is above the level of VREF by a specified voltage (Vih) and the input is a valid logic level "low" when it is below the level of VREF by a specified voltage (Vil). The Stub Series-Terminated Logic (SSTL) interface standard intended for high-speed memory interface applications is an example of just such a protocol and it would be highly advantageous to provide an input buffer which simultaneously exhibits higher speed operation while requiring reduced power levels as compared to conventional circuit implementations.

SUMMARY OF THE INVENTION

Disclosed herein is a high-speed, low-power input buffer for integrated circuit devices in which the input voltage (VIN) is coupled to both a pull-up and a pull-down device. An input buffer in accordance with the present invention utilizes a reference voltage input (VREF) during a calibration phase of operation but not when in an active operational mode. The input buffer of the present invention further provides a maximum level of through current when VIN=VREF and lower levels of through current at all other VIN voltages. In an integrated circuit device incorporating an input buffer as disclosed, two (or more) input buffers may be utilized per device input pin.

Particularly disclosed herein is an integrated circuit device including at least one input buffer which comprises a pull-up device operatively coupled to a first voltage node, a pull-down device operatively coupled between the pull-up device and a second voltage node, wherein the pull-up and pull-down devices are coupled to receive a input voltage signal and an output node intermediate the pull-up and pull-down devices.

Further disclosed herein is an integrated circuit input buffer which comprises an input terminal for receiving an input voltage signal, an output terminal for providing an output voltage signal in response to the input voltage signal when the input buffer is in an operational phase thereof and a reference voltage terminal for providing a reference voltage signal to the input buffer while it is in an alternative calibration phase of operation.

Also disclosed herein is a method for operating an input buffer for an integrated circuit device having input and reference voltage inputs wherein the method comprises providing a first level of through current to an output node of the input buffer when a first voltage on the input voltage input is substantially equal to a second voltage on the reference voltage input and providing a second lesser level of through current to the output node when the first voltage is not substantially equal to the second voltage.

Still further disclosed herein is an integrated circuit device which comprises at least two input buffers coupled to at least one input pin of the integrated circuit device. In a particular embodiment, the input buffers are alternatively in operational and calibration phases of operation.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
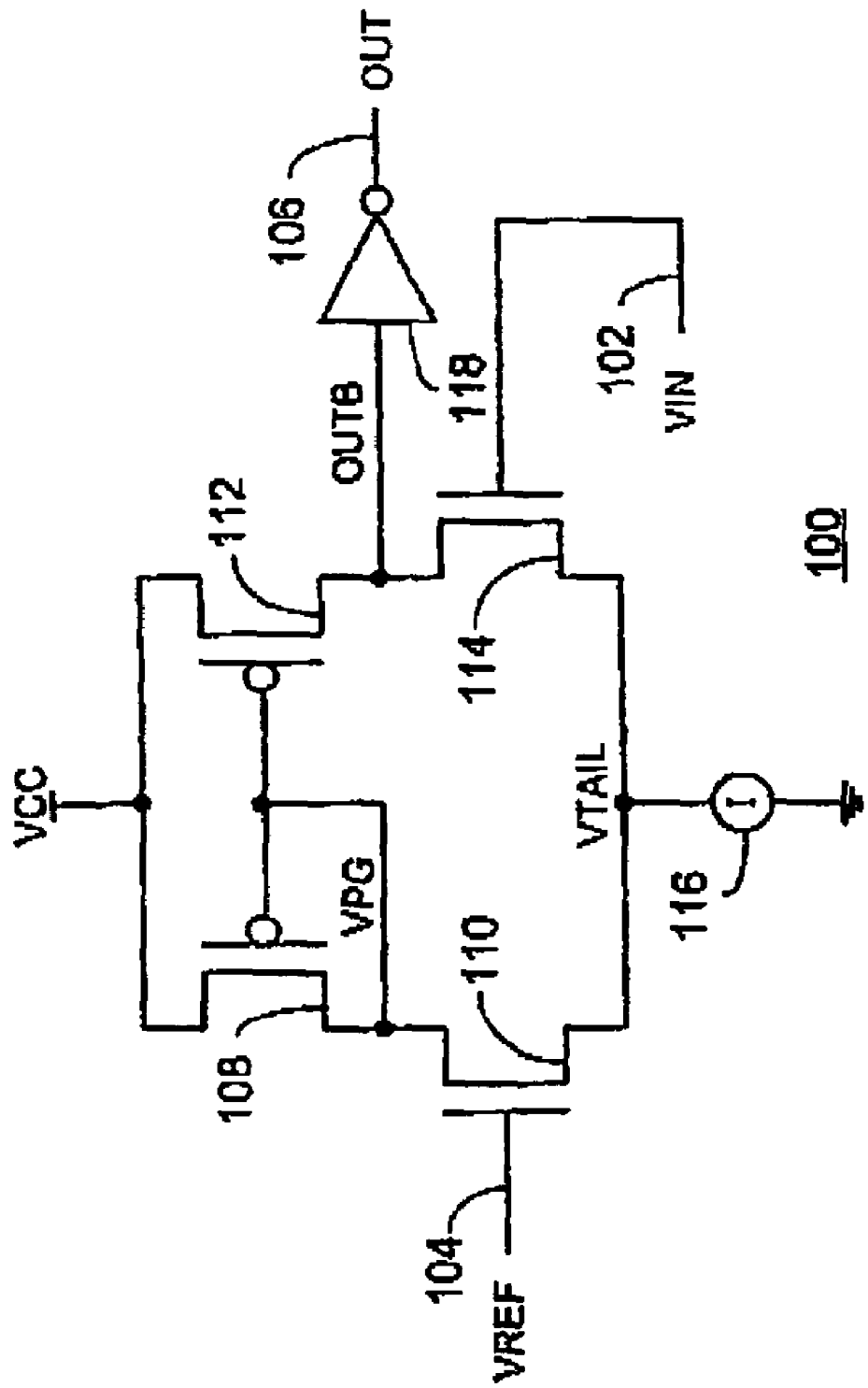
FIG. 1 is a schematic illustration of a conventional input buffer in the form of a differential amplifier having VREF as one input and VIN as another.

With reference now to FIG. 1, a schematic illustration of a conventional input buffer 100 is shown in the form of a differential amplifier having the signal VIN as one input on line 102 and VREF as another on line 104. The conventional input buffer 100 provides an output signal (OUT) on line 106 in response as shown.

The conventional input buffer 100 comprises a P-channel transistor 108 connected in series with an N-channel transistor 110 coupled between a supply voltage (VCC) connected to the source of transistor 108 and a node VTAIL at the source of transistor 110. The common connected drain terminals of transistors 108 and 110 (node VPG) are connected to the gate of transistor 108 while the gate of transistor 110 is connected to receive the VREF signal on line 104.

Similarly, a P-channel transistor 112 is also connected in series with an N-channel transistor 114 coupled between VCC connected to the source of transistor 112 and the node VTAIL at the source of transistor 114. The common connected drain terminals of transistors 112 and 114 provide the signal OUTB (output bar). The gate of transistor 112 is connected to node VPG while the gate of transistor 110 is connected to receive the VIN signal on line 102. The node VTAIL is connected to a current source 116 coupled to circuit ground (VSS) while the OUTB signal is provided to the input of an inverter 118 to furnish the output signal OUT.

Functionally, as the VIN signal rises above the level of VREF, the signal OUTB goes "low" causing the output signal OUT to go "high". As VIN transitions below the level of VREF, the signal OUTB goes "high" causing the signal OUT to go "low". The amount of current drawn by the conventional input buffer 100 is limited by the current source 116 and increasing the amount of current that it can provide can serve to increase the speed of the conventional input buffer 100.

Figure 2:
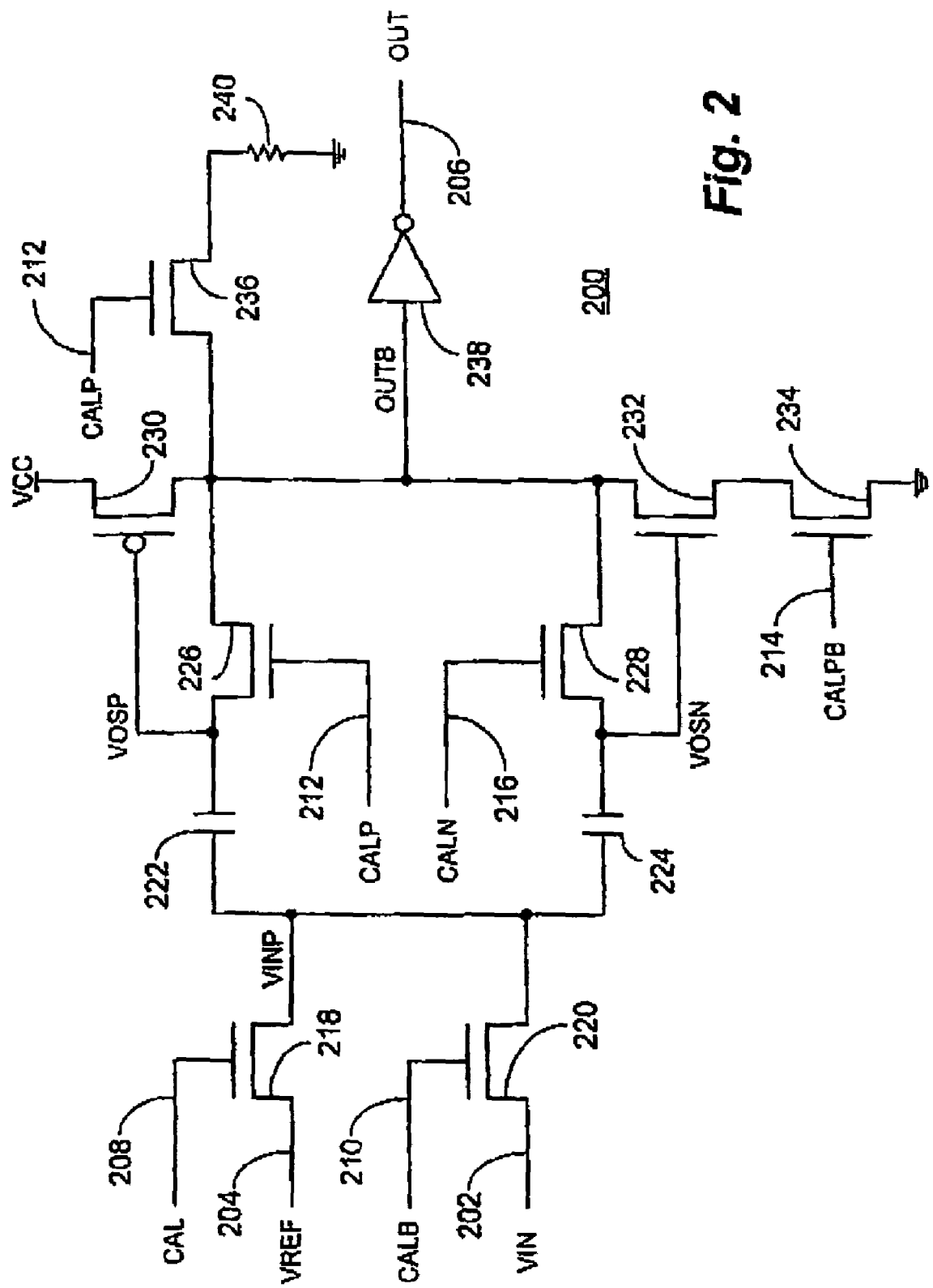
FIG. 2 is a representative schematic illustration of a high-speed, low-power input buffer in accordance with an embodiment of the present invention utilizing a number of calibration signals in conjunction with VREF and VIN input signals.

With reference additionally now to FIG. 2, a representative schematic illustration of a high-speed, low-power input buffer 200 in accordance with an embodiment of the present invention is shown. The input buffer 200 receives a VIN signal on line 202 and a VREF signal on line 204 to ultimately provide an output signal OUT on line 206. A calibration signal (CAL) is provided on line 208 coupled to the gate terminal of N-channel transistor 218 which has one terminal coupled to receive the VREF signal on line 204 and the other terminal coupled to node VINP. In like manner, a complementary calibration signal (CALB) is provided on line 210 coupled to the gate terminal of N-channel transistor 220 which has one terminal coupled to receive the VIN signal on line 202 and the other terminal also coupled to node VINP.

A pair of capacitors 222 and 224 respectively couple the node VINP to a terminal of N-channel transistor 226 at node VOSP and N-channel transistor 228 at node VOSN. The gates of transistors 226 and 228 receive CALP and CALN calibration signals on lines 212 and 216 respectively while their remaining terminals are coupled to node OUTB. A P-channel transistor has its source terminal coupled to VCC and its drain coupled to node OUTB with its gate coupled to node VOSP.

A corresponding N-channel transistor 232 has its drain terminal coupled to node OUTB and its source terminal coupled to circuit ground through series coupled N-channel transistor 234. The gate terminal of transistor 232 is coupled to node VOSN while the gate terminal of transistor 234 receives a CALPB signal on line 214. The CALP signal on line 212 is also coupled to the gate terminal of N-channel transistor 236 which has one terminal coupled to node OUTB and the other terminal coupled through resistor 240 to circuit ground. The node OUTB is coupled through an inverter 238 to provide the output signal OUT on line 206. As distinguished from the conventional input buffer 100 (FIG. 1), the high-speed, low power input buffer 200 of the present invention is implemented in conjunction with a number of calibration signals.

Figure 3:
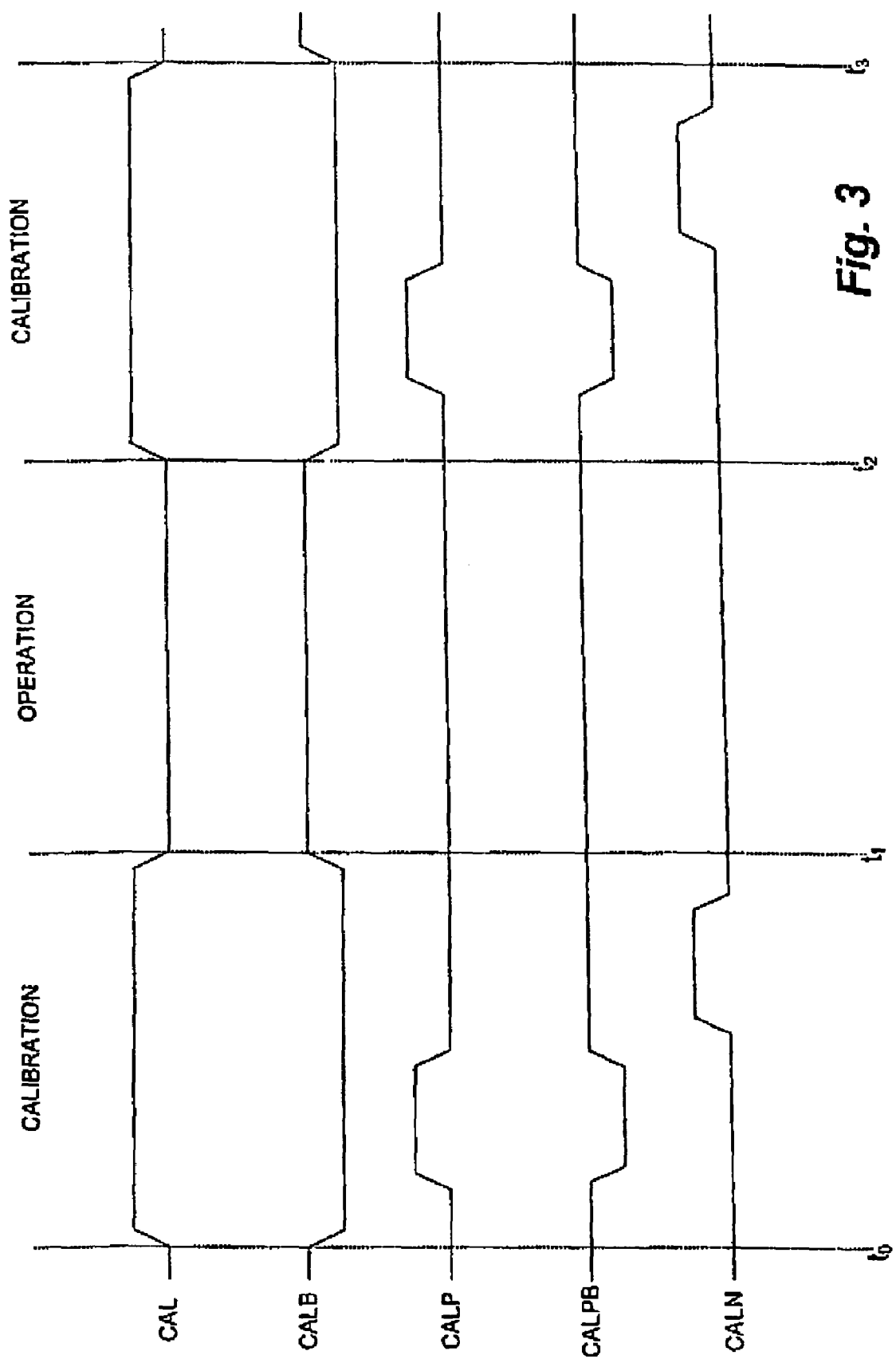
FIG. 3 is a representative waveform diagram illustrating the relative timing of the calibration signals depicted in the preceding figure.

With reference additionally now to FIG. 3, during a calibration phase of operation, the CAL signal on line 208 first goes "high" while the complementary CALB signal on line 210 goes "low". Thereafter, the CALP signal on line 212 goes "high" and the complementary CALPB signal on line 214 goes "low". The node OUTB is pulled "low" by resistor 240 through transistor 236 until the current through transistor 230 equals the current through resistor 240. The value of resistor 240 may be advantageously chosen to cause transistor 230 to pull an optimum amount of current. It should be noted that the function of resistor 240 may also be implemented through other techniques providing a suitable source of current such as, for example, the substitution of a relatively long channel length, narrow width transistor for transistor 236 thereby obviating the need for resistor 240.

Since, at this time, transistor 226 is "on", the voltage on node VOSP is equal to the voltage at node OUTB, where VOSP is the voltage at the gate of transistor 230. The voltage difference between that on node VOSP and VCC is the gate-to-source voltage ($V_{GS}$) of transistor 230 and will be a function of temperature and the transistor 230 process variations.

The CALP signal on line 212 is then brought "low", and the CALPB and CALN signals, on lines 214 and 216 respectively, taken "high". The current through transistor 230 is determined primarily by the $V_{GS}$ of transistor 230, so the voltage on node OUTB will rise until the current through transistor 232 is equal to the current through transistor 230. The signal CALN on line 216 is then brought "low". At this time, the voltage at node VOSP and VOSN are the gate voltages of transistors 230 and 232 respectively. The amount of current through transistor 232 is matched to the amount of current through transistor 230. The CAL signal on line 208 is then taken "low" and the CALB signal on line 210 is taken "high" taking the voltage on node VINP to the level of VIN.

As VIN moves up from the level of VREF, the current through transistor 230 will decrease while the current through transistor 232 will increase. Correspondingly, as the level of VIN moves down from the level of VREF, the current through transistor 230 will increase while the current through transistor 232 will decrease.

In the representative embodiment of the high-speed, low-power input buffer 200 illustrated, the $V_{GS}$ of both transistors 230 and 232 vary in direct response to VIN, resulting in large differential current being supplied to node OUTB. In contrast, the $V_{GS}$ of transistor 114 in the conventional input buffer 100 (FIG. 1) also varies with VIN but the variation of the $V_{GS}$ is offset by the change in the voltage on node VTAIL. The $V_{GS}$ of transistor 112 varies only as a result of the variation of the voltage on node VTAIL causing the $V_{GS}$ of transistor 110 to change and thereby causing the voltage on node VPG to change.

Further, the AC pull-up or pull-down current of the conventional input buffer 100 is limited to approximately the current source 116 set level of current while the high-speed, low-power input buffer 200 of the present invention is not so limited. In fact, the maximum through current of the input buffer 200 occurs when VIN is equal to VREF. As the level of VIN increases, transistor 230 shuts "off" and transistor 232 turns "on". The drive current of transistor 232 is determined primarily by the $V_{GS}$ of transistor 232 so the node OUTB will be driven "low" until it is nearly equal to VSS. As the level of VIN decreases, transistor 232 shuts "off" and transistor 230 turns "on". The drive current of transistor 230 is also determined mainly by the $V_{GS}$ of transistor 230, so the node OUTB will be driven "high" until it is nearly equal to the level of VCC.

As shown particularly in FIG. 3, during an operational phase (from time $t_1$ to $t_2$), the signal CAL is at a logic level "low" and the complementary CALB signal is at a logic level "high" while the CALP and CALN signals are at a logic level "low" and the CALPB signal is at a logic level "high". As can further be determined, the input buffer 200 is not "available" 100% of the time (i.e. from times $t_0$ to $t_1$ and times $t_2$ to $t_3$), which poses a functional limitation if the specification for an integrated circuit employing the same does not provide for a calibration time period or implement a design employing two input buffers 200 for each input. In the latter instance, one of the two input buffers 200 may be calibrated while the other is being used. And although superficially appearing to be somewhat of a penalty in terms of on-chip die area required, in reality input buffers are physically very small in comparison to integrated circuit bonding pads and associated electro static discharge (ESD) circuits. Consequently, providing two input buffers 200 per integrated circuit device pad (or pin) is not actually much of a penalty.

Figure 4:
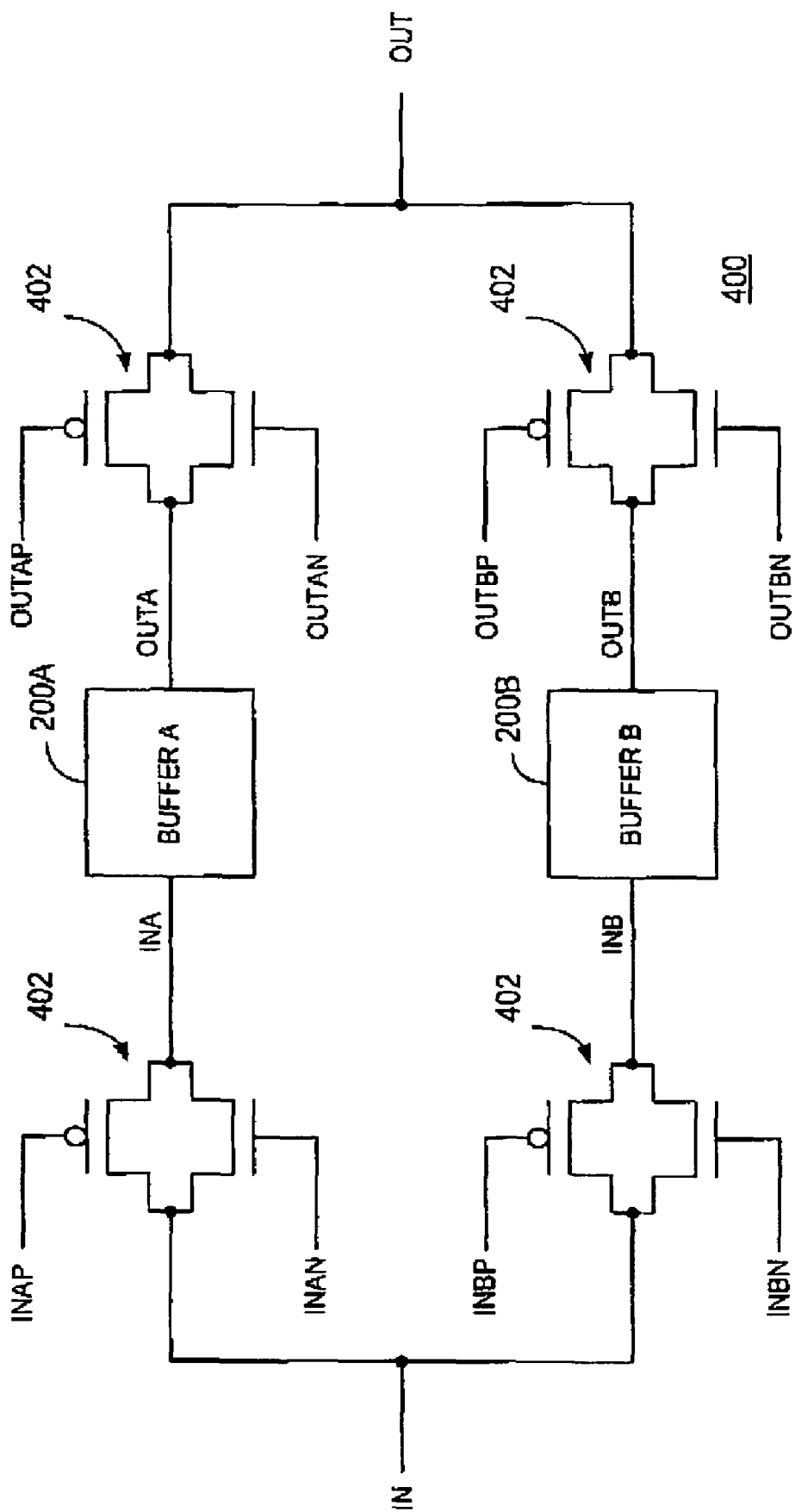
FIG. 4 is a representative functional block diagram of a possible implementation of a system for an integrated circuit device in accordance with the present invention in which two high-speed, low-power input buffers are employed enabling one to be calibrated while the other is utilized.

With reference additionally now to FIG. 4, a representative functional block diagram of a possible implementation of a system 400 in accordance with the present invention is shown in which two high-speed, low-power input buffers 200A and 200B are employed enabling one to be calibrated while the other is utilized. As shown, a common input line (IN) is supplied to the input buffers 200A and 200B through respective complementary metal oxide semiconductor (CMOS) transmission (or "pass") gates $402_{INA}$ and $402_{INB}$ on lines INA and INB. Outputs from the input buffers 200A and 200B on lines OUTA and OUTB are then supplied to a common output line (OUT) through corresponding CMOS transmission gates $402_{OUTA}$ and $402_{OUTB}$.

As illustrated, and as will be more fully described hereinafter, the transmission gates $402_{INA}$ and $402_{INB}$ receive, respectively, the complementary signals INAP/INAN and INBP/INBN. Similarly, the transmission gates $402_{OUTA}$ and $402_{OUTB}$ receive, respectively, the complementary signals OUTAP/OUTAN and OUTBP/OUTBN.

In operation, input buffer 200A may be calibrated while buffer 200B is being used. Both input buffers 200A and 200B may be used in parallel in those instances where nodes OUTA and OUTB are outputting the same data. This may be assured by turning the transmission gate $402_{INA}$ "on" before turning on the transmission gate $402_{OUTA}$.

Figure 5:
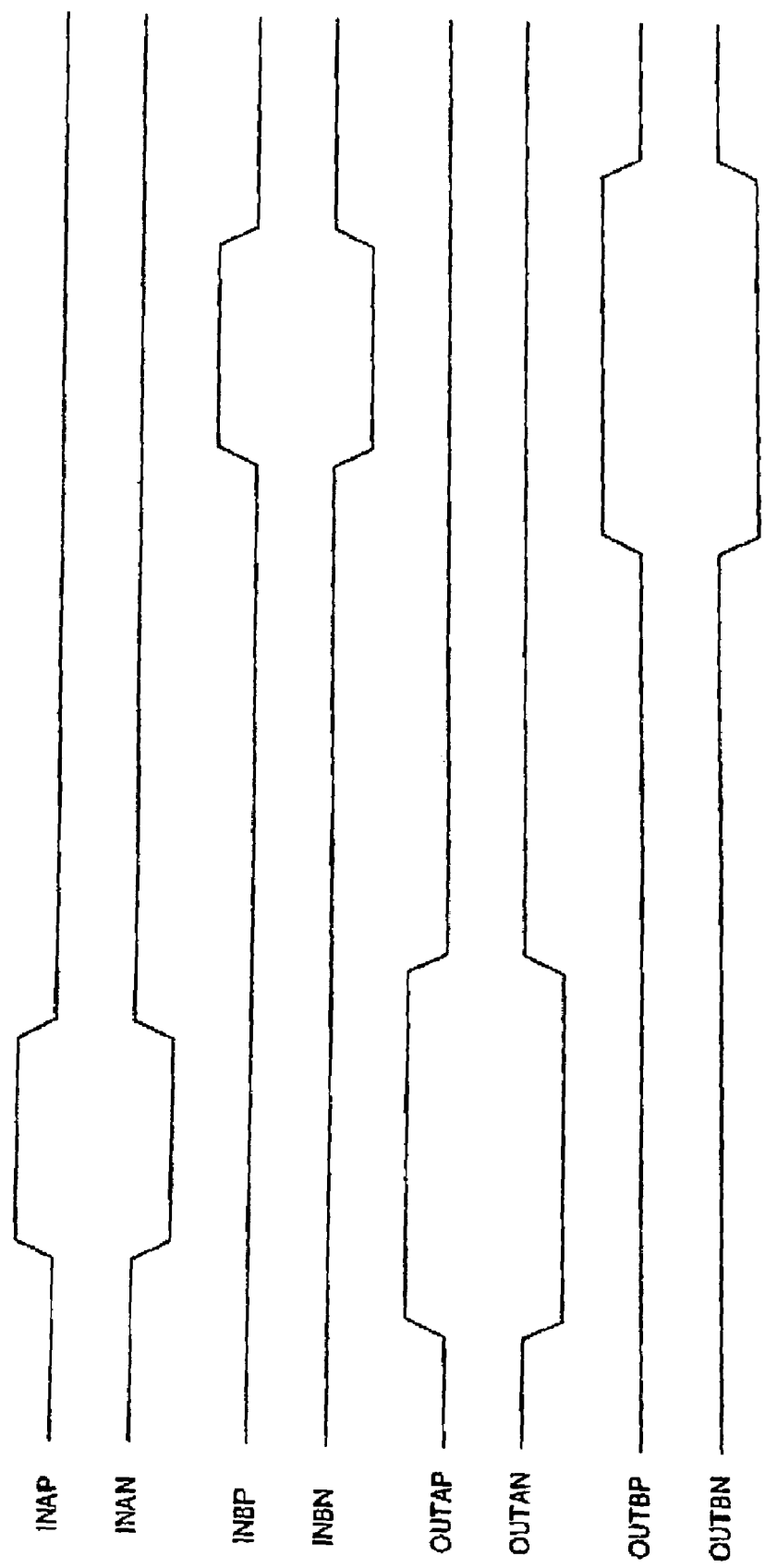
FIG. 5 is a representative waveform diagram illustrating the relative timing of the input and output gating signals depicted in the preceding figure.

With reference additionally now to FIG. 5, a representative waveform diagram is presented illustrating the relative timing of the input and output gating signals depicted in the preceding figure. As shown, the timing of the gating signals to the various pass gates 402 is such that the signals INAP and INAN are asserted after OUTAP and OUTAN have been asserted, and the former signals are de-asserted before the latter signals have themselves been de-asserted. In like manner, the signals INBP and INBN are asserted after OUTBP and OUTBN have been asserted, and the former signals are then de-asserted before the latter signals have themselves been de-asserted.

The frequency with which it is necessary to calibrate an input buffer 200 in accordance with the present invention is a function of the leakage from nodes VOSP and VOSN (FIG. 2) and the capacitance of capacitors 222 and 224. Practically, it is difficult to attempt a calibration at as high a frequency as the input buffer 200 can operate when not in the calibration mode. Therefore, a lower frequency is generally desirable for initiation of a calibration cycle. When used in conjunction with dynamic random access memory (DRAM) devices, the self-refresh mode signal may be utilized as an example. For a clocked device, such as synchronous DRAM (SDRAM) or synchronous static random access memory (SRAM), for example, the output of a clock counter may also be used.

It should be noted that the order of calibration of transistors 230 and 232 (FIG. 2; with the former being calibrated first, followed by the latter) could be reversed with only minor changes needed to the embodiment of the input buffer 200 described and illustrated. Further, the nodes VOSN and VOSP may alternatively be coupled below VSS or above VCC respectively. It is also recommended that the body voltage of transistors 226 and 228 be chosen to preclude forward biasing of the body to their source/drain junctions.

While there have been described above the principles of the present invention in conjunction with specific circuitry and device types, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A method for operating an input buffer for an integrated circuit device having input and reference voltage inputs thereto, said method comprising;
   said input buffer allowing a first level of through current through pull-up and pull-down devices of the input buffer when a first voltage on said input voltage input is substantially equal to a second voltage on said reference voltage input; and
   said input buffer allowing a second lesser level of through current through the pull-up and pull-down devices of the input buffer when said first voltage on said input voltage input is not substantially equal to said reference voltage input.

* * * * *